United States Patent [19]

Yazawa

[11] Patent Number: 4,879,647
[45] Date of Patent: Nov. 7, 1989

[54] WATCHDOG TIMER CIRCUIT SUITED FOR USE IN MICROCOMPUTER

[75] Inventor: Akira Yazawa, Tokyo, Japan

[73] Assignee: NEC Corporation, Tokyo, Japan

[21] Appl. No.: 873,020

[22] Filed: Jun. 11, 1986

[30] Foreign Application Priority Data

Jun. 11, 1985 [JP] Japan .................. 60-126676

[51] Int. Cl.⁴ .............. G06F 11/28; G06F 11/00; G04F 8/00
[52] U.S. Cl. .................. 364/200; 368/121; 371/62; 364/267.9; 364/267
[58] Field of Search ... 364/200 MS File, 900 MS File, 364/369; 368/107, 108, 110, 113, 121; 320/1; 371/14, 61, 62

[56] References Cited

U.S. PATENT DOCUMENTS

| | | | |
|---|---|---|---|
| 3,299,627 | 1/1967 | Hart | 368/110 |
| 3,403,269 | 9/1968 | Thompson | 368/121 |
| 3,452,283 | 6/1969 | O'Neal, Jr. | 368/108 |
| 4,265,371 | 5/1981 | Desai | 364/900 |
| 4,282,584 | 8/1981 | Brown | 364/900 |
| 4,301,360 | 11/1981 | Blair | 368/121 |
| 4,504,155 | 3/1985 | Ruggieri | 368/121 |
| 4,531,198 | 7/1985 | Matsuda | 364/900 |
| 4,594,685 | 6/1986 | Owens | 364/900 |
| 4,689,766 | 8/1987 | Kent | 371/62 |
| 4,696,002 | 9/1987 | Schleupen et al. | 371/62 |
| 4,763,296 | 8/1988 | Gercekci | 371/62 |
| 4,803,682 | 2/1989 | Hara et al. | 371/62 |

Primary Examiner—Gareth D. Shaw
Assistant Examiner—Rebecca L. Rudolph
Attorney, Agent, or Firm—Sughrue, Mion, Zinn, Macpeak & Seas

[57] ABSTRACT

A watchdog timer circuit employed in a microcomputer is disclosed. The watchdog timer circuit detects the occurrence of a program abnormal termination or an infinite loop operation and includes a capacitor, a charging circuit charging the capacitor when a predetermined instruction is executed, a discharging circuit discharging the capacitor when other instructions are executed, a detection circuit detecting the voltage across the capacitor and producing a detection signal when the voltage across the capacitor becomes smaller than a reference voltage, and a reset circuit resets the microcomputer to its initial state in response to an abnormal detection circuit. When the program termination or an infinite loop operation occurs, the predetermined instruction is not executed for a long period of time. The capacitor continues to be discharged. As a result, the detection signal is produced. The microcomputer is thereby reset to its initial state.

15 Claims, 6 Drawing Sheets

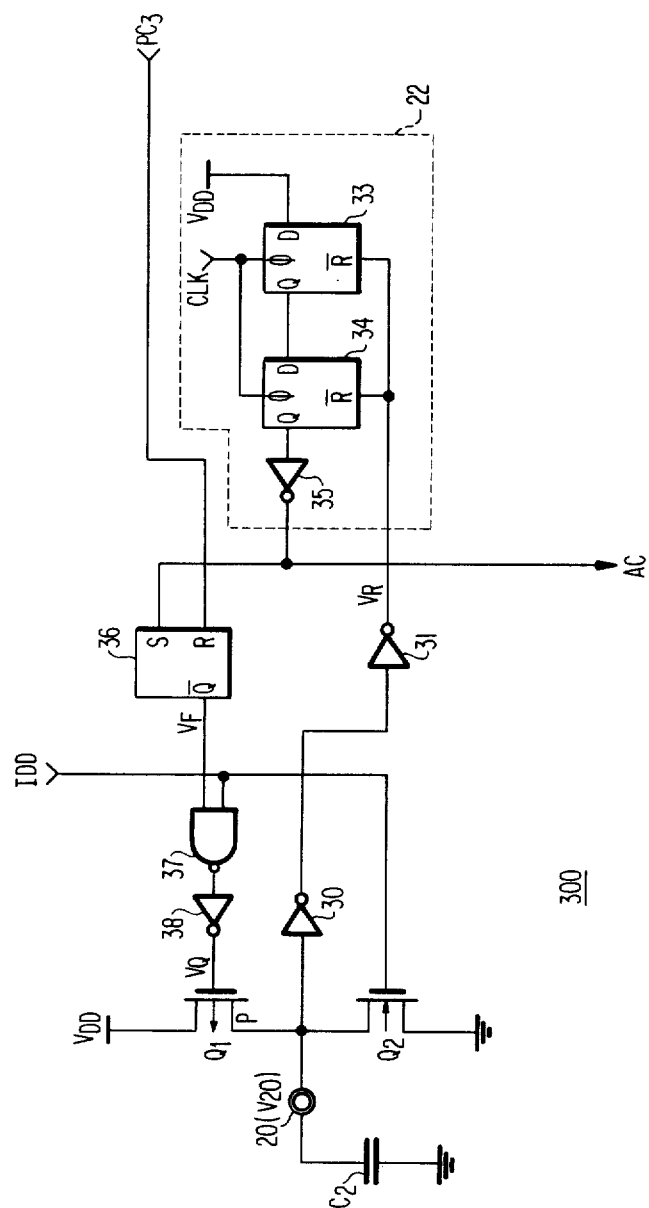

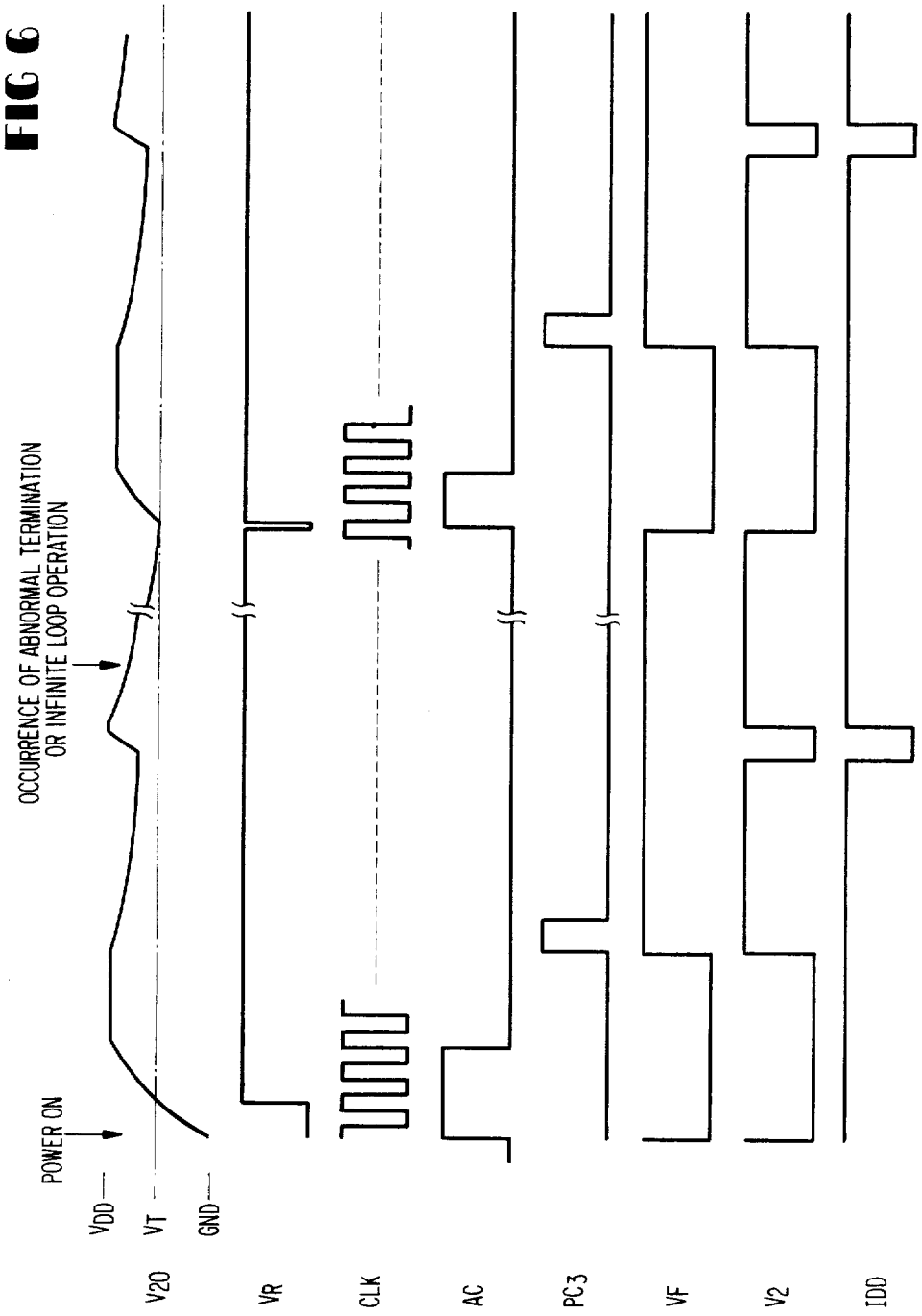

WATCHDOG TIMER CIRCUIT SUITED FOR USE IN MICROCOMPUTER

BACKGROUND OF THE INVENTION

The present invention relates to a timer circuit, and more particularly to a watchdog timer circuit suited for use in a microcomputer to detect abnormal program execution such as abnormal termination of the program and infinite-loop operation.

In an information processing equipment such as a microcomputer, there sometimes occurs a program abnormal termination or an operation within an infinite loop. In order to detect such abnormal program execution, a watchdog time circuit is employed.

A prior art watchdog time circuit is constituted by a counter having a reset function and counting a clock signal. This counter is reset cyclically by a program. The reset operation of the counter by the program is carried out within a time when the count value of the counter does not overflow. Accordingly, so long as the program is executed normally, the overflow signal is not obtained from the counter. On the other hand, when the program is abnormally executed, the counter is not reset, so that the counter produces the overflow signal. The overflow signal brings a program counter into an initial condition. The information processing equipment is thereby returned to a normal operation state.

However, the counter requires a large number of bits construction even in a microcomputer. For this reason, a semiconductor chip is made large in area and a large power is consumed in a one-chip microcomputer equipped with the prior art watchdog timer.

SUMMARY OF THE INVENTION

Therefore, an object of the present invention is to provide a timer circuit having a simplified circuit construction and a reduced power consumption.

Another object of the present invention is to provide an improved watchdog timer circuit suited to be formed within the same semiconductor chip as a microcomputer.

A timer circuit according to the present invention comprises a capacitor, means for periodically charging the capacitor, means for discharging the capacitor with a predetermined time constant, and means for detecting a voltage across the capacitor to generate a control signal.

In a microcomputer, the discharging capacitor is charged periodically by a program before the voltage thereacross reaches the detecting level of the detecting means. Accordingly, when the program is executed normally, the control signal is not generated. On the other hand, if there occurs the abnormal program execution such as the program abnormal termination and the operation in the infinite loop, the capacitor continues discharging without being charged. As a result, the voltage is reduced below a predetermined level and the control signal is generated, so that a program counter is reset into an initial condition, for example. The microcomputer is thereby returned to a normal operation state to execute the program normally.

The time constant of the discharging means is selected such that the voltage across the capacitor does not take a value below the predetermined level within the interval between the charging periods upon the normal operation, so that the generation of the control signal represents the abnormal operation.

BRIEF DESCRIPTION OF THE DRAWINGS

The above and other objects, advantages and features of the present invention will be more apparent from the following description taken in conjunction with the accompanying drawings, in which

FIG. 5 is a circuit diagram according to still another embodiment of the present invention; and FIG. 6 is a timing chart for representing an operation of the circuit shown in FIG. 5.

DETAILED DESCRIPTION OF THE PREFERRED EMBODIMENT

Figure 1:
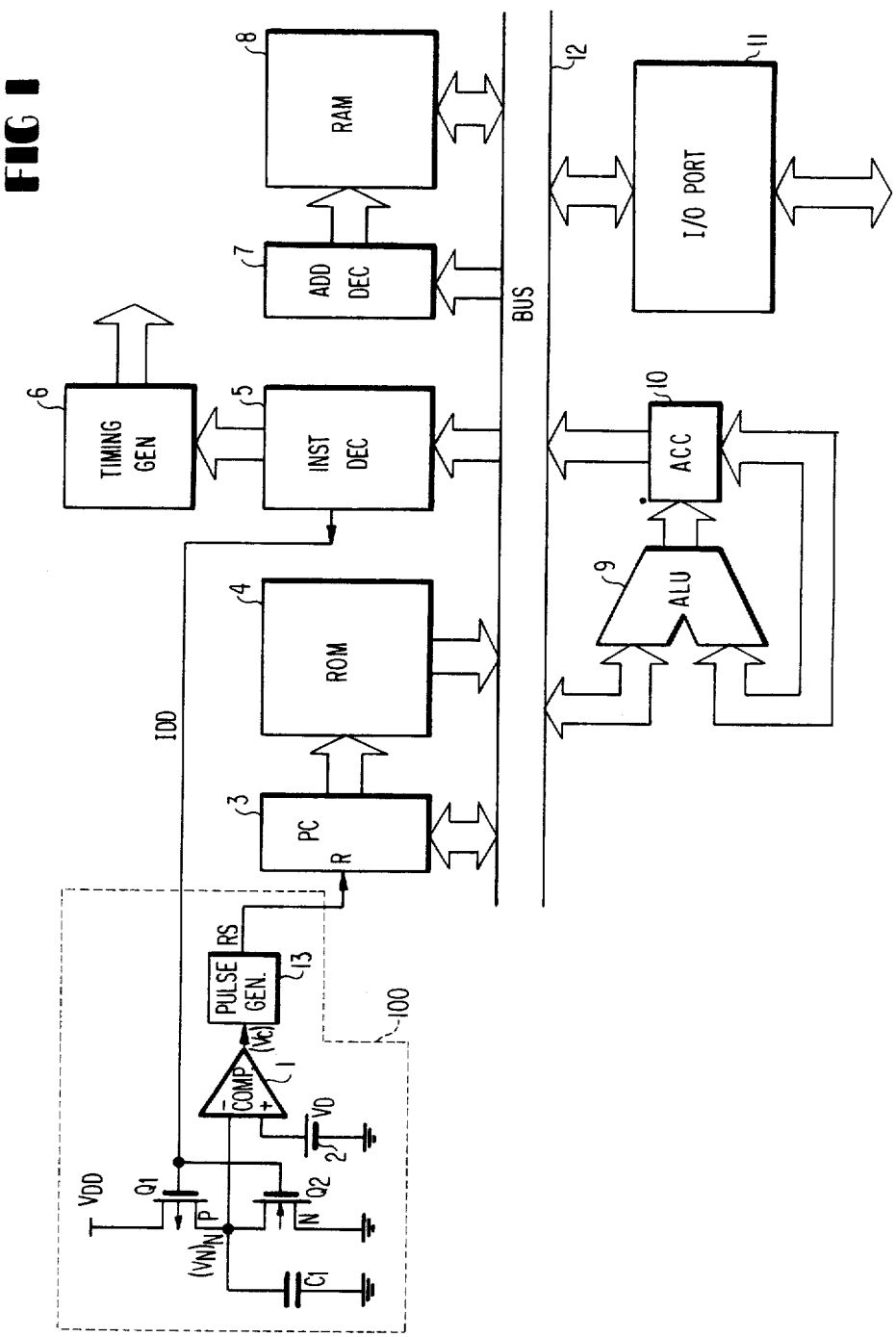
FIG. 1 is a circuit block diagram according to one embodiment of the present invention.

FIG. 1 shows a microcomputer equipped with a watchdog timer circuit according to one embodiment of the present invention. A read-only memory (called hereinafter as an "ROM") 4 stores a plurality of instructions for controlling an operation sequence according to a program, the addresses thereof being designated in order by a program counter 3. The instructions read out of the ROM 4 are supplied to an instruction decoder 5 through an internal bus 12. The decoder 5 decodes the instructions and supplies the decoded result to a timing generator 6. The generator 6 generates predetermined timing signals to attain the instruction processing. A random access memory (called hereinafter as an "RAM") 8 stores data to be processed or the processed data, and its addresses are supplied by an address decoder 7 in response to a set of address signals supplied via the internal bus 12. An arithmetic logic unit (called hereinafter as an "ALU") 9 performs a logical operation and supplies its result to an accumulator 10. The data in the accumulator 10 is supplied to the RAM 8 or the ALU 9 through the internal bus 12. An input/output port 11 is coupled bidirectionally to the internal bus 12, so that the data of an instrument to be controlled (not shown) is transferred to the internal bus 12 or the data on the internal bus 12 is transferred to the instrument to be controlled.

The above-described circuit block is same as that of a prior art microcomputer, but the microcomputer shown in FIG. 1 includes a new watchdog timer circuit 100. This timer circuit 100 has a capacitor $C_1$, P-channel and N-channel MOS (Metal Oxide Semiconductor) transistors $Q_1$ and $Q_2$, a comparator 1, a reference voltage source 2, and a one-shot pulse generator 13. The transistor $Q_1$ is connected between a node N and a power potential $V_{DD}$ supply terminal. The transistor $Q_2$ and the capacitor $C_1$ are connected in parallel between the node N and a ground potential point. The node N is connected to an inverting input terminal of the comparator 1 whose non-inverting input terminal is supplied with a reference voltage $V_0$ from the voltage source 2. The output of the comparator 1 is supplied to the pulse generator 13 whose one-shot pulse output is in turn supplied to a reset terminal R of the program counter 3 as a reset pulse RS. The transistors $Q_1$ and $Q_2$ are controlled by a signal IDD. When the signal IDD takes a low level, the transistor $Q_1$ is turned ON to charge the capacitor $C_1$. When the signal IDD takes a high level, the transistor $Q_2$ is turned ON to discharge the capacitor $C_1$. This signal IDD is produced from the instruction decoder 5 and therefore takes the low level in response to a particular instruction read-out from the ROM 4. It is convenient to employ an "NOOP" (or "NOP") instruction as this particular instruction. The NOOP instruction is frequently used in a sequence of programs, and the execution of the NOOP instruction provides no change in signal conditions which are obtained by the instruction that has been executed just before the NOOP instruction.

Figure 2:
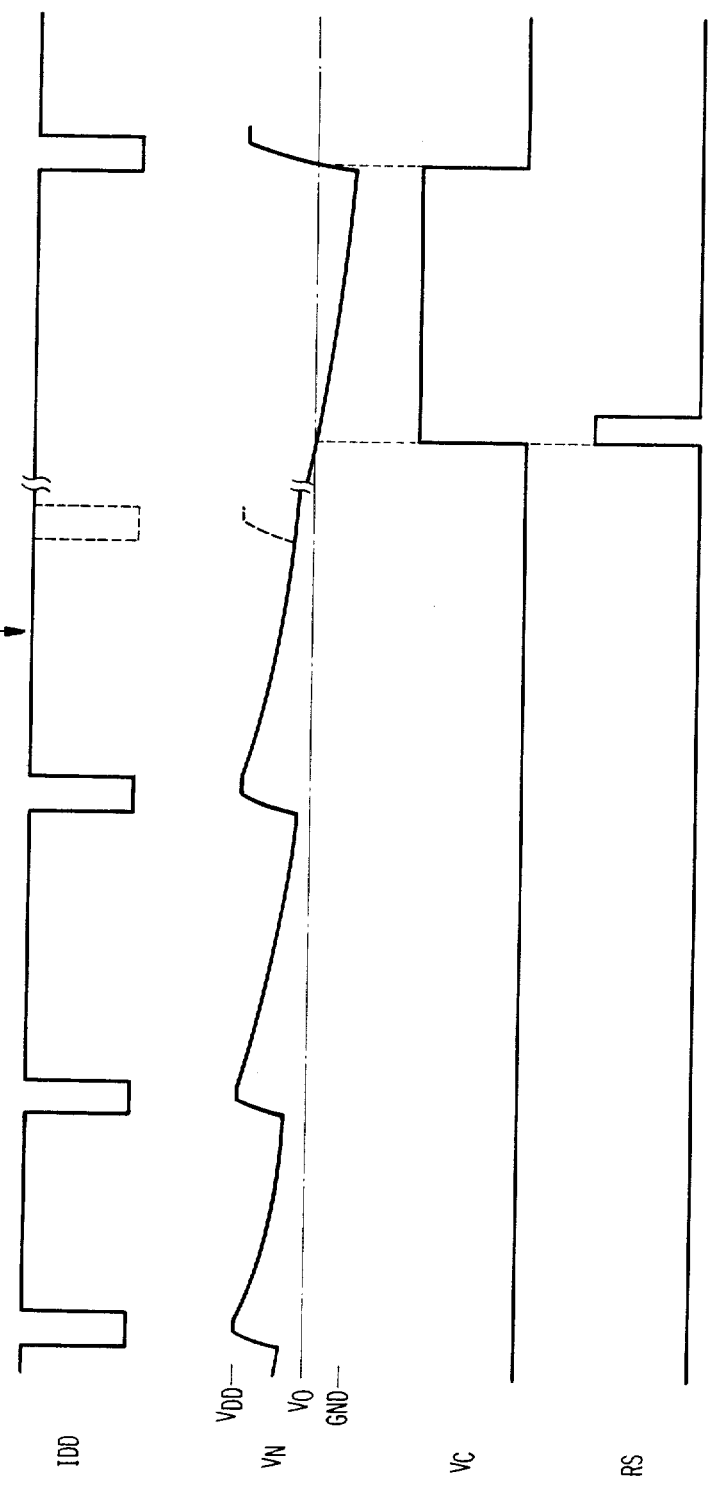
FIG. 2 is a timing chart for representing an operation of the circuit shown in FIG. 1.

In FIG. 2, the timing chart representative of the signal IDD, the voltage $V_N$ at the node N, the output voltage $V_C$ of the comparator 1 and the reset pulse PS is shown. When the program counter 3 designates the address of the ROM 4 in which the NOOP instruction is stored, the decoder 5 produces the low level signal IDD. The transistor $Q_1$ is thereby turned ON to charge the capacitor $C_1$. Since the transistor $Q_1$ has a relatively large current capability, the capacitor $C_1$ is charged to about $V_{DD}$ level during the execution period of the NOOP instruction. The count value of the program counter 3 advances thereafter by one, so that the instruction other than the NOOP instruction is executed. The signal IDD is inverted into the high level to turn the transistors $Q_1$ and $Q_2$ OFF and ON, respectively. The capacitor $C_1$ is thereby discharged. The discharge of the capacitor $C_1$ continues until the count value of the program counter 3 advances and the next NOOP instruction is executed, but the current capability of the transistor $Q_2$ is designed to be considerably small, so that the capacitor $C_1$ is discharged slowly. The execution of the next NOOP instruction charges the capacitor $C_1$ to the $V_{DD}$ level, and after the end of the instruction, the capacitor $C_1$ is discharged. Thus, the capacitor $C_1$ is charged every time when the NOOP instruction is executed, and is discharged when other instructions are executed. Therefore, the voltage across the capacitor $C_1$ is represented by $V_N$ in FIG. 2. The NOOP instruction is executed within a time when the voltage $V_N$ does not become smaller than the reference voltage $V_0$. In other words, the time constant of the capacitor $C_1$ and the conductive resistance of the transistor $Q_2$ is selected such that the voltage $V_N$ does not become smaller than the reference voltage $V_0$ within an interval between the NOOP instructions upon the normal operation. Accordingly, so long as the program is executed normally, the voltage $V_N$ does not take a value smaller than the reference voltage $V_0$. The output $V_C$ of the comparator 1 receiving the voltages $V_N$ and $V_0$ holds therefore the low level, and the reset pulse RS is not produced.

On the other hand, the program abnormal terminal or the operation in the infinite loop occurs, the charging operation of the capacitor $C_1$ is not carried out as shown by dotted lines in FIG. 2. The capacitor $C_1$ continues to be discharge, so that the voltage $V_N$ thereacross becomes smaller than the reference voltage $V_0$. The comparator 1 inverts its output $V_C$ from the high level to the low level. The occurence of the program abnormal termination and the operation in the infinite loop is thus detected. The pulse generator 13 generates the reset pulse RS of a one-shot shape in response to the change in the output $V_C$ from the low level to the high level. The reset pulse RS is supplied to the reset terminal R of the program counter 3 to bring the counter 3 into the initial value, all zero, for example. The microcomputer shown in FIG. 1 is thereby returned to the initial state of the program from the abnormal terminal or the infinit loop operation. When the reset pulse RS disappears, the program counter 3 starts to count, so that the program is executed. At a time when the NOOP instruction is executed, the capacitor $C_1$ is charged to the $V_{DD}$ level, and the output $V_C$ of the comparator 1 is inverted to the low level.

As described above, by charging the capacitor $C_1$ periodically (this cycle period is not fixed, but changed more or less in accordance with the program as shown in FIG. 2) by a predetermined instruction ("NOOP" or "NOP" instruction in this embodiment) and by detecting the voltage thereacross, the program abnormal termination and the infinite loop operation are detected and the system is returned to a normal condition. Moreover, the number of the circuit elements is decreased more remarkably than the prior art circuit, so that the area occupied on a semiconductor chip is reduced and the power consumption becomes very small. Incidently, the capacitor $C_1$ requires a relatively large capacitance, and therefore it is connected to one-chip microcomputer as an externally provided component.

Figure 3:
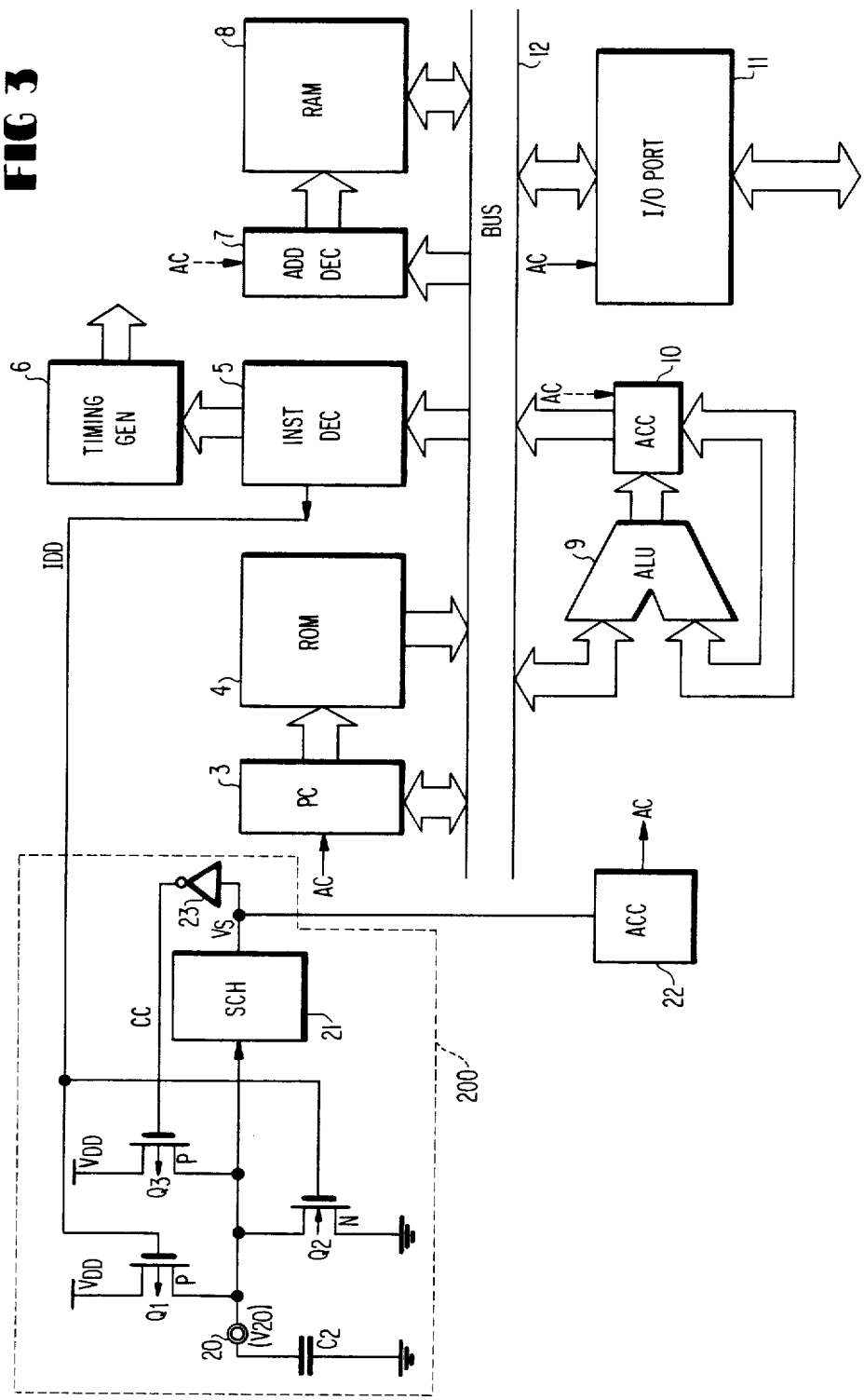
FIG. 3 is a circuit block diagram according to another embodiment of the present invention.

Many microcomputers further include a power-on clear function using a capacitor, this function resetting internal circuits into the initial conditions in response to the fact that the voltage across the capacitor is zero just when the power is ON. According to the present invention, the capacitor used for the power-on clear function can be also used for the watchdog timer circuit. Such a watchdog timer circuit 200 is shown in FIG. 3 as another embodiment of the present invention. In FIG. 3, the same constituents as those shown in FIG. 1 are denoted by the same references.

The microcomputer shown in FIG. 3 includes a power-on clear terminal 20, and a capacitor $C_2$ is connected between the terminal 20 and the ground point. The transistors $Q_1$ and $Q_2$ respond to the signal IDD and control the charging and discharging of the capacitor $C_2$ as also mentioned in FIG. 1. A P-channel MOS transistor $Q_3$ is connected in parallel to the transistor $Q_1$ and supplied at its gate with a signal CC which is an inverted signal of an output $V_S$ of a Schmitt-trigger circuit 21. The voltage at the terminal 20, i.e. the voltage $V_{20}$ across the capacitor $C_2$, is supplied to the Schmitt-trigger circuit 21, and the output $V_S$ thereof is supplied to an all-clear circuit 22.

Figure 4:
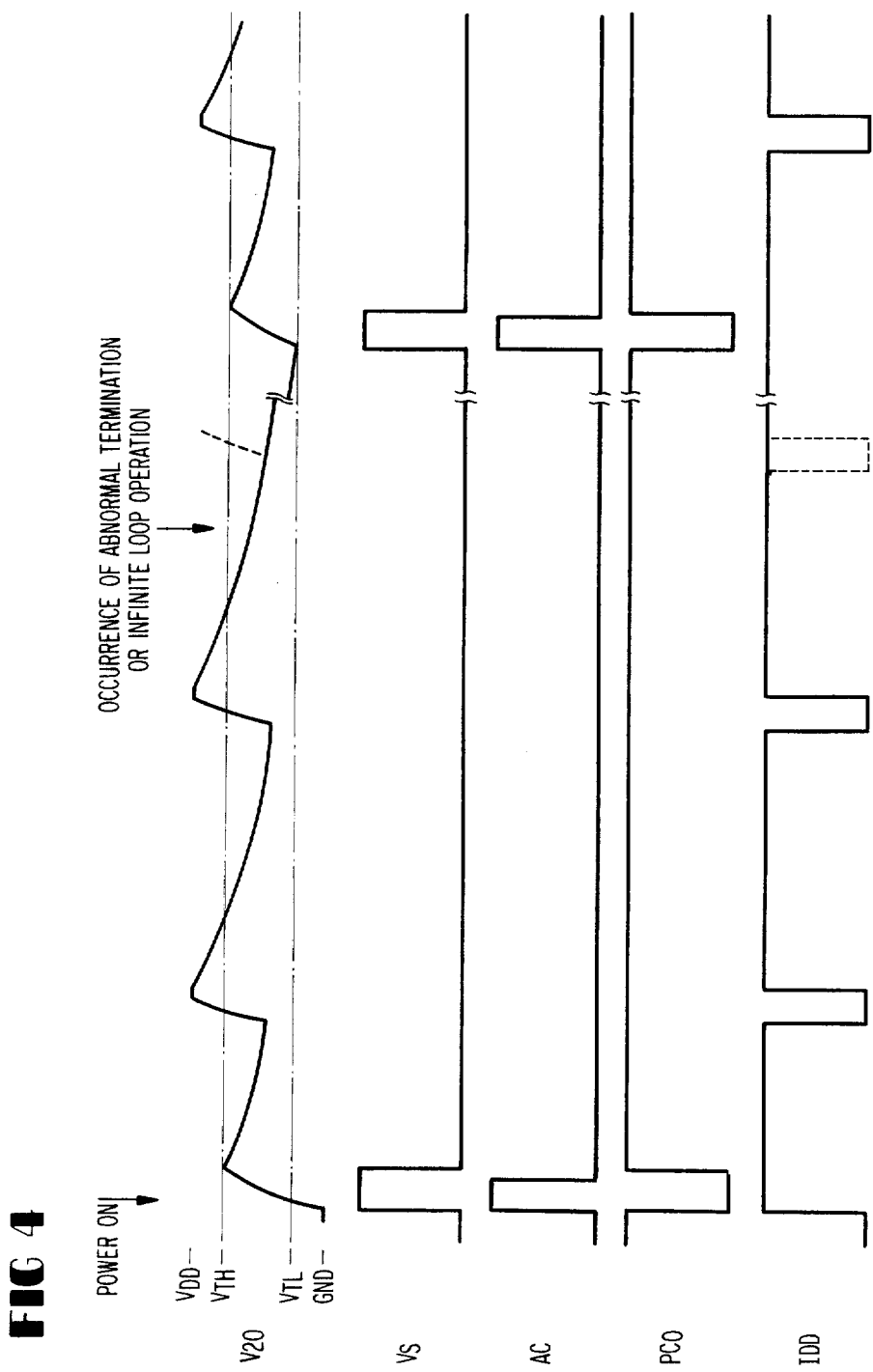
FIG. 4 is a timing chart for representing an operation of the circuit shown in FIG. 3.

Upon the power switching-on, the voltage $V_{20}$ across the capacitor $C_2$ is zero as shown in FIG. 4, and therefore the Schmitt-trigger circuit 21 produces the high level output $V_S$. The all-clear circuit 22 thus generates an all-clear signal AC having a predetermined pulse width. This signal AC is supplied to the program counter 2 and the input/output port 11, and in some cases further supplied to the address decoder 7 and the accumulator 10 to reset these circuits into an initial state. Since the signal $V_S$ is in the high level, the signal CC takes the low level. The transistor $Q_3$ is thereby turned ON to charge the capacitor $C_2$. When the signal AC disappears, the program counter 2 starts to count and the program is executed. As described in FIG. 1, the transistor $Q_2$ is turned ON when the instruction other than the NOOP instruction is executed, but the transistor $Q_3$ has current capability that is considerably larger than the transistor $Q_2$, so that the capacitor $C_2$ maintains to be charged. When the charging of the capacitor $C_2$ advances to a level that is equal to a high threshold level $V_{TH}$ of the Schmitt-trigger circuit 21, the circuit 21 produces the low level output $V_S$ to turn the transistor $Q_3$ OFF. The transistor $Q_2$ discharges the capacitor $C_2$, but the Schmitt-trigger circuit 21 takes its low threshold level $V_{TL}$, so that the output $V_S$ holds the low level.

When the NOOP instruction in the program is executed, the transistor $Q_1$ is turned ON to charge the capacitor $C_2$ to the $V_{DD}$ level. The transistor $Q_2$ discharges the capacitor $C_2$ after the end of the NOOP instruction. The program is composed such that the NOOP instruction is executed within a time when the voltage $V_{20}$ across the capacitor $C_2$ does not become smaller than the low threshold level $V_{TL}$ of the Schmitt-trigger circuit 21. Therefore, so long as the program is executed normally, the Schmitt-trigger circuit 21 holds its low level output $V_S$.

When the program abnormal termination or the infinite loop operation occurs, the charging to the capacitor $C_1$ represented by dotted lines in FIG. 4 is not carried out, so that the transistor $Q_2$ discharges the capacitor $C_2$ to the level that is smaller than the lower threshold voltage $V_{TL}$ of the Schmitt-trigger circuit 21. The circuit 21 thereby produces the high level output $V_S$ and the all-clear signal AC is generated. The program counter 3 and other circuits are thus returned to their initial state, so that the program is again executed from the first instruction.

In this embodiment, the capacitor $C_2$ which is provided previously for the power-on clear function is also used for the watchdog time circuit 200.

The initial charging of the capacitor $C_2$ can be carried out by the transistor $Q_1$ in place of the transistor $Q_3$, and another circuit may be employed in place of the Schmitt-trigger circuit 21 to detect the voltage across the capacitor $C_2$. Such a watchdog timer circuit 300 is shown in FIG. 5 as still another embodiment of the present invention. It is noted that only the watchdog timer circuit 300 and the all-clear circuit 22 are shown in FIG. 5 and other circuit blocks shown in FIG. 3 are omitted.

In FIG. 5, the signal IDD is supplied to the gate of the transistor $Q_2$ and one input terminal of an NAND circuit 37. The output of the NAND circuit 37 is supplied via an inverter 38 to the gate of the transistor $Q_1$. The terminal 20 is connected via two inverters 30 and 31 to the reset terminals $\overline{R}$ of D-type flip-flop circuits (called hereinafter as "D-FFs") 33 and 34. When the output $V_R$ takes the low level, the D-FFs 33 and 34 are reset. The data terminal D of the D-FF 33 is connected to the power voltage ($V_{DD}$) terminal, and the output Q terminal thereof is connected to the data terminal D of the D-FF 34. The all-clear signal AC is produced by an inverter 35 supplied with an output of the D-FF 34. The signal AC is also supplied to the set terminal S of an S-R flip-flop circuit (called hereinafter as an "S-R FF") 36. The clock terminals $\phi$ of the D-FFs 33 and 34 are supplied with a clock signal CLK. The reset terminal R of the S-R FF 36 is supplied with a signal $PC_3$ from the third bit of the program counter 3 (FIG. 3). The inverted output $\overline{Q}$ of the S-R FF 36 is supplied to the other input terminal of the NAND circuit 37.

FIG. 6 shows a timing chart of the circuit shown in FIG. 5. Upon the power switching-on, the charge in the capacitor $C_2$ is zero, and therefore the output $V_R$ of the inverter 31 takes a low level to reset the D-FFs 33 and 34. The all-clear signal AC takes the high level to bring the program counter 3 and other circuits (FIG. 3) into the initial states. The S-R FF 36 is set and hence its inverted output $V_F$ takes the low level. The output $V_Q$ of the inverter 38 therefore takes the low level to turn the transistor $Q_1$ ON. The capacitor $C_2$ is thereby charged. When the charging level exceeds the threshold level $V_T$ of the inverter 30, the signal $V_R$ is inverted into the high level. The D-FFs 33 and 34 are released from their reset states and thus shifts the data level, i.e. the high level, at the data terminal D of the D-FF 33 in synchronism with the clock signal CLK. The all-clear signal AC is thereby inverted into the low level, so that the program counter 3 (FIG. 3) starts to operate to execute the program. The instruction decoder 5 (FIG. 3) produces the high level signal IDD to turn the transistor $Q_2$ ON, but since the transistor $Q_1$ is maintained in the ON state by the S-R FF 36 and has the current capability that is considerably larger than the transistor $Q_2$, the capacitor $C_2$ is charged to a level that is smaller a little than the $V_{DD}$ level. The count value of the address counter 3 (FIG. 3) advances and then the high level appears at the third bit of the counter 3. The signal $PC_3$ thereby takes the high level to reset the S-R FF 36. As a result, the transistor $Q_1$ is turned OFF and the capacitor $C_2$ is discharged slowly by the transistor $Q_2$. When the NOOP instruction in the program is executed, the signal IDD takes the low level. The transistor $Q_1$ is thereby turned ON to chage the capacitor $C_2$ to the $V_{DD}$ level. In response to the end of the NOOP instruction, the transistor $Q_2$ discharges the capacitor $C_2$.

When the program abnormal termination or the infinite loop operation occurs, the charging of the capacitor $C_2$ is stopped, so that the voltage $V_{20}$ across the capacitor $C_2$ becomes smaller than the threshold level $V_T$ of the inverter 30. As a result, the signal $V_R$ takes the low level to reset the D-FFs 33 and 34. The all-clear signal AC is thereby inverted to the high level. The program counter 3 and other circuits (FIG. 3) are reset to their initial states, and the S-R FF 36 is set to turn the transistor $Q_1$ ON. The signal $V_R$ is inverted to the high level immediately to release the D-FFs 33 and 34 from the reset states. The above-mentioned circuit operation is thereafter carried out.

Also in this embodiment, the program abnormal termination and the infinite loop operation are detected by using the capacitor for the power-on clear function, and the returning to the normal operation from the abnormal conditions is carried out by utilizing the all-clear circuit.

As described above, the present invention provides a watchdog timer circuit having a simplified circuit construction and a reduced power consumption. Moreover, the design of the time constant in the watchdog timer circuit facilitates the program composition, and the capacitor used for a power-on clear function is also used for the watchdog timer circuit.

The present invention is not limited to the above-mentioned embodiments, but may be changed and modified without departing from the scope and spirit of the present invention. For example, the capacitor may be charged by the execution of another or other instructions in place of the NOOP instruction, and the voltage across the capacitor can be detected by other circuits.

What is claimed is:

1. A microcomputer comprising a program memory storing a plurality of instructions at respective addresses, a program counter designating each address of said program memory for reading each instruction therefrom, an instruction decoder decoding the instruction read from said program memory to generate decoded signals, execution means for executing the instruction read from said program memory in response to said decoded signals, said instruction decoder including means for producing a first signal taking a first logic level when a predetermined instruction is decoded and taking a second logic level when other instructions are decoded, a capacitor, a first transistor coupled between said capacitor and a potential terminal, means responsive to said first logic level of said first signal for turning said first transistor ON, said first transistor charging said capacitor, a second transistor coupled in parallel to said capacitor, means for turning said second transistor ON in response to said second logic level of said first signal, said second transistor discharging said capacitor through said second transistor, said first transistor having a current capability larger than the current capability of said second transistor so that the charging time constant of said capacitor is smaller than the discharging time constant of said capacitor means for producing a second signal when a voltage across said capacitor becomes smaller than a reference voltage, and means responsive to said second signal for resetting said program counter.

2. A timer circuit comprising a first terminal supplied with a power potential, a second terminal supplied with a reference potential, a node, a capacitor connected between said node and said second terminal, circuit means for producing a control signal which changes periodically between a first logic level and a second logic level, first switching means coupled between said first terminal and said node and responsive to said first logic level of said control signal for electrically connecting said first terminal to said node to charge said capacitor, said first switching means having a first conductive resistance and said first switching means being made nonconductive in response to said second logic level of said control signal to disconnect said first terminal from said node, second switching means coupled between said node and said second terminal and in parallel with said capacitor and made conductive in response to said second logic level of said control signal for electrically connecting said node to said second terminal to discharge said capacitor through said second transistor said second switching means having a second conductive resistance and said second switching means being made nonconductive in response to said first logic level of said control signal to disconnect said node from said second terminal, said first conductive resistance of said first switching means being smaller than said second conductive resistance of said second switching means, and means coupled to said node for detecting a voltage between said node and said second terminal to produce a detection signal when said voltage becomes smaller than a reference voltage, whereby said detection signal represents that said control signal is held at said second logic level due to an error operation of said circuit means.

3. The timer circuit as claimed in claim 2, wherein said first switching means includes a first transistor connected between said first terminal and said node and having a control gate supplied with said control signal, and said second switching means includes a second transistor connected between said node and said second terminal in a parallel with said capacitor and having a control gate supplied with said control signal, said first transistor being of one conductivity type and said second transistor being of an opposite conductivity type.

4. The time circuit as claimed in claim 3, wherein said detecting means includes a comparator supplied at its one input terminal with said voltage between said node and said second terminal and at its other output terminal with said reference voltage.

5. The timer circuit as claimed in claim 3, wherein said detecting means includes a Schmitt-trigger circuit supplied with said voltage between said node and said second terminal.

6. The timer circuit as claimed in claim 3, wherein said detecting means includes an inverter supplied with said voltage between said node and said second terminal.

7. A watchdog timer circuit used in a microcomputer including means for generating a control signal which changes cyclically between a first logic level and a second logic level as said microcomputer executes instructions in predetermined sequence, said watchdog timer comprising a power terminal, a reference terminal, a node, a capacitor connected between said node and said reference terminal, a first transistor connected between said power terminal and said node for feeding, when turned ON, a current to said capacitor to charge said capacitor, said first transistor having a predetermined current feeding capability, means responsive to said control signal for turning said first transistor ON when said control signal takes said first logic level and for turning said first transistor OFF when said control signal takes said second logic level, a second transistor connected between said node and said reference terminal and in parallel with said capacitor for drawing, when turned ON, a current from said capacitor to discharge said capacitor through said second transistor, said second transistor having a predetermined current drawing capability that is smaller than said predetermined current feeding capability of said first transistor, means responsive to said control signal for turning said second transistor ON when said control signal takes said second logic level and for turning said second transistor OFF when said control signal takes said first logic level, detection means connected to said node for detecting a voltage across said capacitor to produce a detection signal when said voltage becomes smaller than a reference voltage, and means responsive to said detection signal for resetting said microcomputer to an initial state, whereby said detection signal is produced when said generating means generates said control signal which is held at said second logic level due to the fact that said microcomputer does not execute said instructions in said predetermined sequence.

8. A microcomputer comprising a program memory storing a series of instruction for a program, a program counter designating each address of said program memory for reading each instruction therefrom in predetermined sequence, execution means for executing the instruction read from said program memory, means for generating a first control signal taking a first logic level when a predetermined instruction is read from said program memory and taking a second logic level when other instructions are read from said program memory, a power-on clear terminal, a power terminal a reference terminal, a capacitor connected between said power-on clear terminal and said reference terminal, a detection circuit connected to said power-on clear terminal and detecting a voltage across said capacitor to produce a second control signal when said voltage is smaller than a predetermined level, a reset circuit bringing said program counter into an initial state in response to said second control signal, charging means coupled between said power terminal and said power-on clear terminal for operatively charging said capacitor, first activating means responsive to said second control signal for commanding said charging means to charge said capacitor, second activating means response to said first logic level of said first control signal for commanding said charging means to charge said capacitor, discharging means coupled between said power-on clear terminal and said reference terminal for operatively discharging said capacitor, and third activating means responsive to said second logic level of said first control signal for commanding said discharging means to discharge said capacitor, whereby said program counter is brought into said initial state not only when a power voltage is actuated to be supplied to said power terminal but when said program counter does not read the instructions from said program memory in said predetermined sequence.

9. The microcomputer as claimed in claim 8, wherein said charging means includes first and second transistors connected in parallel between said power terminal and said power-on clear terminal and said discharging means includes a third transistor connected between said power-on terminal and said reference terminal in parallel with said capacitor, said first activating means turning said first transistor ON, said second activating means turning said second transistor ON, and said third activating means turning said third transistor ON.

10. The microcomputer as claimed in claim 9, wherein said detection circuit includes a Schmitt-trigger circuit having a first threshold level which is used as said predetermined level and a second threshold level which is larger than said first threshold level, said Schmitt-trigger circuit withdrawing said second control signal when said voltage across said capacitor is larger than said second threshold level.

11. The microcomputer as claimed in claim 8, wherein said charging means includes a first transistor connected between said power terminal and said power-on clear terminal and said discharging means includes a second transistor connected between said power-on clear terminal and said refernece terminal and in parallel with said capacitor, said first activating means including means for latching said second control signal during a predetermined period of time and means for turning said first transistor ON in response to an output of said latching means, said second activating means including means for turning said first transistor ON in response to said first logic level of said first control signal, and said third activating means including means for turning said second transistor ON in response to said second logic level of said first control signal.

12. A microcomputer comprising a program memory storing a series of instrucitons, said series of instructions periodically including a predetermined instruction, a program counter designating each address of said program memory to read each instruction from said program memory, an instruction decoder decoding the instruction read from said program and outputting decoded signals, said instruction decoder including means for producing a first control signal taking a first logic level whenever said predetermined instruction is read from said program memory and taking a second logic level when other instructions are read from said program memory, execution means responsive to said decoded signals for executing the instruction read from said program memory, a first terminal supplied with a power voltage, a second terminal supplied with a reference voltage, a power-on clear terminal, a capacitor connected between said power-on clear terminal and said second terminal, a detection circuit connected to said power-on clear terminal for detecting a voltage across said capacitor to produce a second control signal when said voltage across said capacitor is smaller than a predetermined level, a clear circuit generating a reset pulse in response to said second control signal and resetting said program counter to an initial state by use of said reset pulse, means for latching said reset pulse to produce a charging control signal until said program counter reaches a predetermined count value, a first field effect transistor connected between said first terminal and said power-on clear terminal for charging, when turned ON, said capacitor, a second field effect transistor connected between said power-on clear terminal and said second terminal in parallel with said capacitor for discharging, when turned ON, said capacitor, means responsive to said charging control signal for turning said first field effect transistor ON, means responsive to said first logic level of said first control signal for turning said first field effect transistor ON, and means responsive second logic level of said first control signal for turning said second field effect transistor ON, whereby said program counter is reset to said initial state not only when said power voltage is switched on to be supplied to said first terminal but when said predetermined instruction is not read from said program memory over a predetermined of time.

13. The microcomputer as claimed in claim 8, wherein said latching means includes a flip-flop circuit which is set by said reset pulse and is reset when said program counter reaches said predetermined count value.

14. The microcomputer as claimed in claim 9, wherein said clear circuit includes counter means reset by said second control signal to generate said reset pulse, said counter means counting a predetermined number of clock pulses to withdraw said reset pulse.

15. The microcomputer as claimed in claim 8, said first field effect transistor having a conductive resistance smaller than a conductive resistance of said second field effect transistor.

* * * * *

UNITED STATES PATENT AND TRADEMARK OFFICE
CERTIFICATE OF CORRECTION

PATENT NO. : 4,879,647
DATED : November 7, 1989
INVENTOR(S) : Yazawa

It is certified that error appears in the above-identified patent and that said Letters Patent is hereby corrected as shown below:

Column 1, line 68, delete "periodes" and insert --periods--;

Column 3, line 61, delete "occurence" and insert --occurrence--;

Column 9, line 42, delete "refernece" and insert --reference--;

Abstract, lines 12 and 13, delete "an abnormal detection circuit. When the" and insert --the detection circuit. When an abnormal--.

Signed and Sealed this

Fifth Day of March, 1991

*Attest:*

HARRY F. MANBECK, JR.

*Attesting Officer*　　　*Commissioner of Patents and Trademarks*